United States Patent [19]
Eckland et al.

[11] Patent Number: 4,736,166
[45] Date of Patent: Apr. 5, 1988

[54] ATTENUATION CIRCUIT

[75] Inventors: Lawrence M. Eckland, Wheaton; Charles J. Marik, Richmond, both of Ill.

[73] Assignee: Motorola, Inc., Schaumburg, Ill.

[21] Appl. No.: 3,895

[22] Filed: Jan. 16, 1987

[51] Int. Cl.⁴ .............................................. H03G 3/00
[52] U.S. Cl. .................................. 330/284; 307/561; 307/565; 330/254
[58] Field of Search ...................... 330/145, 254, 284; 307/542, 544, 549, 551, 553, 559, 557, 561, 565; 333/81 R; 455/249; 323/229, 230, 353, 354

[56] References Cited
U.S. PATENT DOCUMENTS
3,962,650 6/1976 Gay ...................................... 330/254

Primary Examiner—James B. Mullins
Attorney, Agent, or Firm—Steven G. Parmelee

[57] ABSTRACT

An attenuator for use in attenuating an incoming signal. The attenuator includes a primary attenuation unit (12) and a dynamic reference signal unit (13) that provides a reference signal that substantially tracks a DC component associated with the attenuator. A comparison unit (14) subtracts the reference signal from the attenuated signal to provide an attenuated signal substantially free of unwanted signal components. In one embodiment of the invention, a variable impedance unit (101) can be provided to supplement the attenuation action of the attenuator (12) and effectively expand the attenuation range of the circuit and thereby provide greater freedom from distortion.

17 Claims, 4 Drawing Sheets

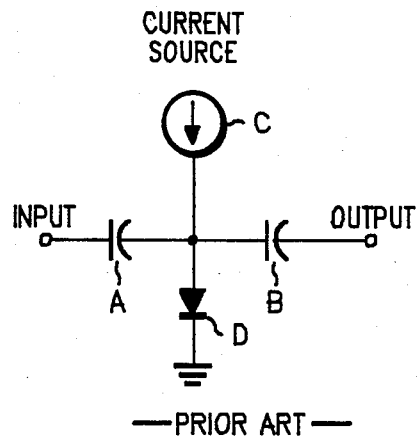
FIG. 1A —PRIOR ART—
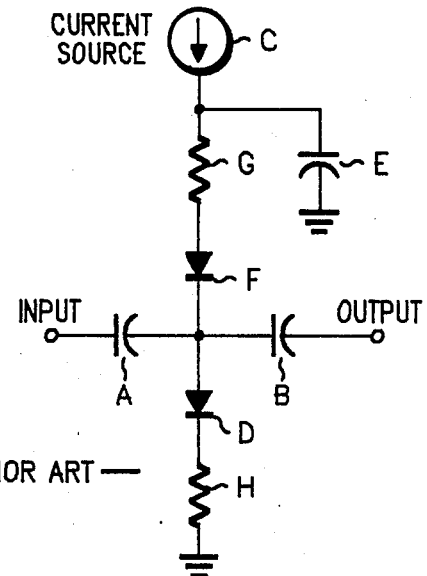
FIG. 1B —PRIOR ART—
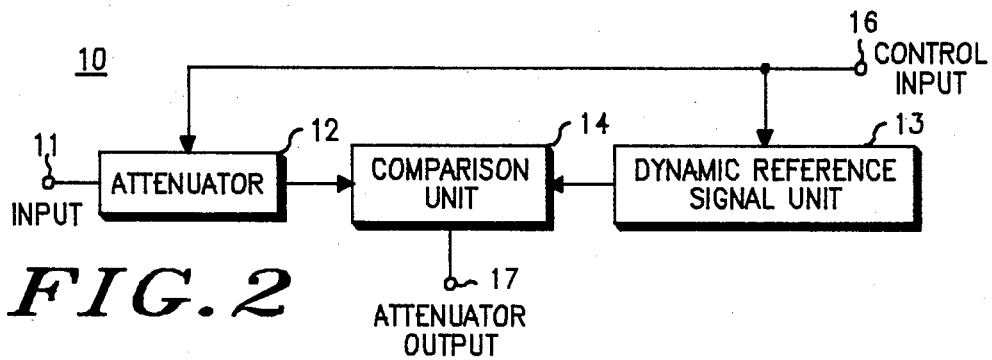
FIG. 2
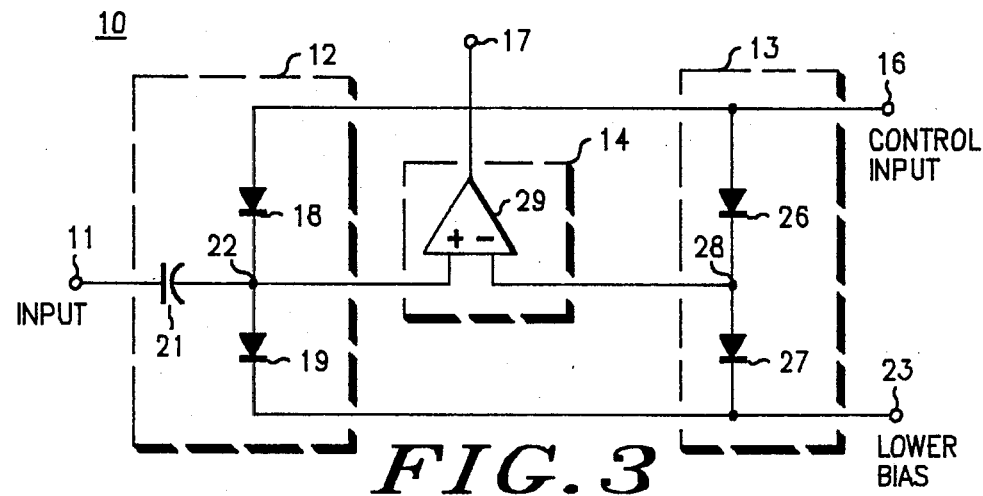
FIG. 3

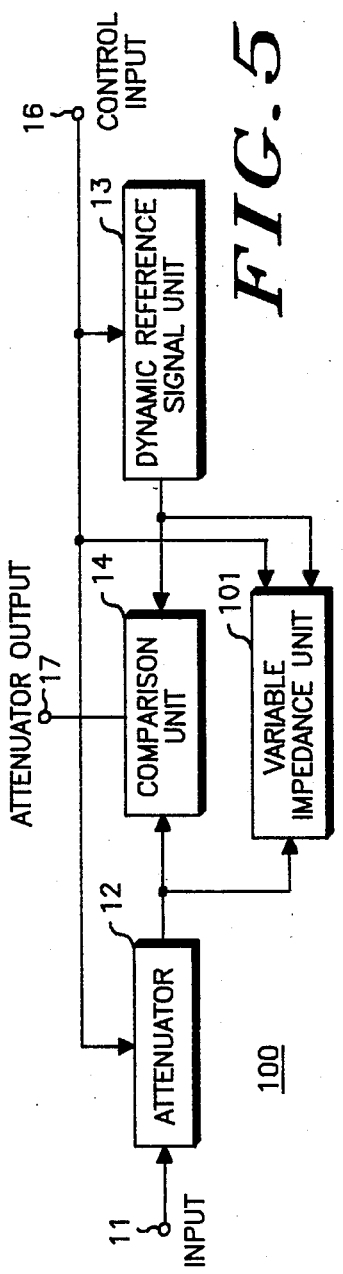
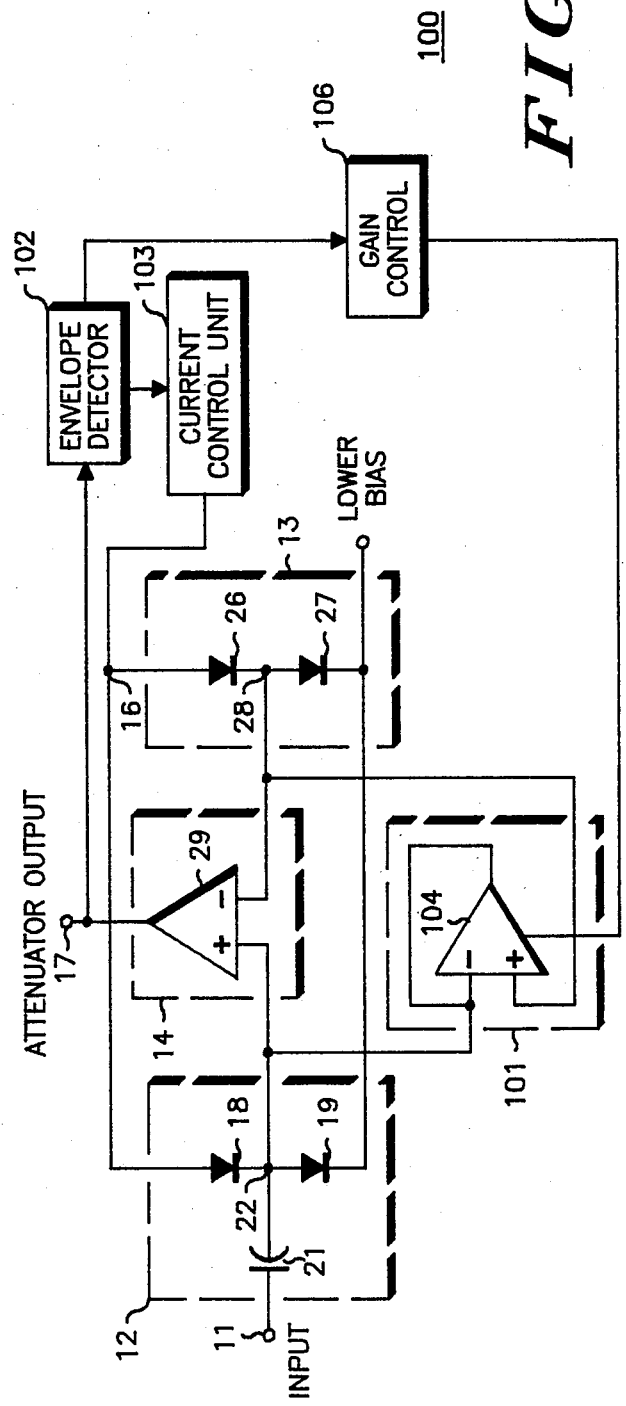

ATTENUATION CIRCUIT

TECHNICAL FIELD

This invention relates generally to attenuation circuits, particularly as used in an IF section of a radio receiver.

BACKGROUND ART

Radio receivers receive and process radio frequency transmitted energy signals to yield, generally, audible information. Typically, the originally received RF signal will be converted to an intermediate frequency (IF) signal prior to reducing the desired signal information yet further to audio levels. Various signal processing functions may occur at the IF level, including signal attenuation as may be necessary to prevent the signal from exceeding a threshold level.

With reference to FIG. 1A, one prior art attenuation circuit for providing such attenuation can be seen to include two coupling capacitors (A and B), a current source (C), and a diode (D). Typically, diodes present an impedance of 26 ohms at one milliamp. This impedance, however, will diminish as current flow through the diode increases For example, with 10 milliamps flowing through such a diode, the impedance presented by the diode will be approximately 2.6 ohms. Therefore, by regulating the flow of current through the diode (D) by appropriate control of the current source (C), the impedance of the diode (D) can be manipulated to govern attenuation of a signal as received at the input.

The above prior art solution presents various problems. Distortion can result with high input signal levels. Further, impedance of the diode (D) cannot be reduced much below, for example, 2.6 ohms in a specific device. Also, because a DC component that moves with the carrier can lead to unsatisfactory signal processing, the two capacitors (A and B) must be provided to guard against this eventuality. In an integrated circuit context, the use of such capacitors poses significant problems with respect to design, manufacture and cost. Further, the response of this circuit tends to be temperature dependent, and this raises important design and performance issues FIG. 1B depicts another prior art attempt at providing a satisfactory attenuation circuit. This circuit again includes the two capacitors (A and B), the current source (C), and the diode (D) of the circuit described above. In addition, this circuit includes a third capacitor (E), a second diode (F), and two low impedance resistors (G and H). This configuration has the advantage of lessening distortion, due to the balanced diode configuration. This circuit also has disadvantages, however. In particular, this circuit requires the low impedance resistors (G and H) on either side of the two diodes (F and D) and also requires the additional capacitor (E). Further, the DC component can still move with current and temperature variations.

There therefore exists a need for an attenuation circuit that can provide satisfactory attenuation with less distortion than currently offered by prior art techniques. There further exists a need for an attenuation circuit that avoids the problems associated with DC movement and the necessity of providing both coupling capacitors.

SUMMARY OF THE INVENTION

These needs and others are substantially met through provision of the attenuation circuit disclosed herein. In one embodiment, this attenuator includes an input for receiving an input signal, an output for providing an output signal that represents the input signal as appropriately attenuated, wherein this output signal may include a DC component that varies with current flow and temperature, a dynamic reference signal unit that provides a reference signal that substantially tracks the above noted DC component, and a comparison unit that receives the output signal and the reference signal to compare these signals and ultimately provide an attenuator output signal that substantially equals the output signal less the reference signal.

In one embodiment, the input and output can be either side of a pair of diodes biased between a control input and a lower bias value. The dynamic reference signal unit can be similarly comprised of two diodes disposed between these same two values. The comparison unit can be comprised of a differential amplifier that receives the outputs of both diode pairs and subtracts one from the other to thereby yield the attenuator output signal.

In another embodiment, a variable impedance unit can be additionally included to provide an additional controllable impedance for effecting attenuation. This variable impedance unit can be comprised of a gain controlled amplifier, the gain of which can effect the impedance of the amplifier unit and which can be controlled in response to the output level of the attenuator output signal. Through use of the variable impedance unit, a greater attenuation range and less distortion can be achieved.

BRIEF DESCRIPTION OF THE DRAWINGS

These and other attributes of the invention will become more clear upon making a thorough review and study of the following description of the best mode for carrying out the invention, particularly when reviewed in conjunction with the drawings, wherein:

FIGS. 1A and B comprise depictions of prior art circuits;

FIG. 2 comprises a block diagram view of a first embodiment;

FIG. 3 comprises a schematic diagram of a first embodiment;

FIG. 5 comprises a block diagram of a second embodiment;

FIG. 6 comprises a schematic diagram of a second embodiment; and

BEST MODE FOR CARRYING OUT THE INVENTION

Figure 4:
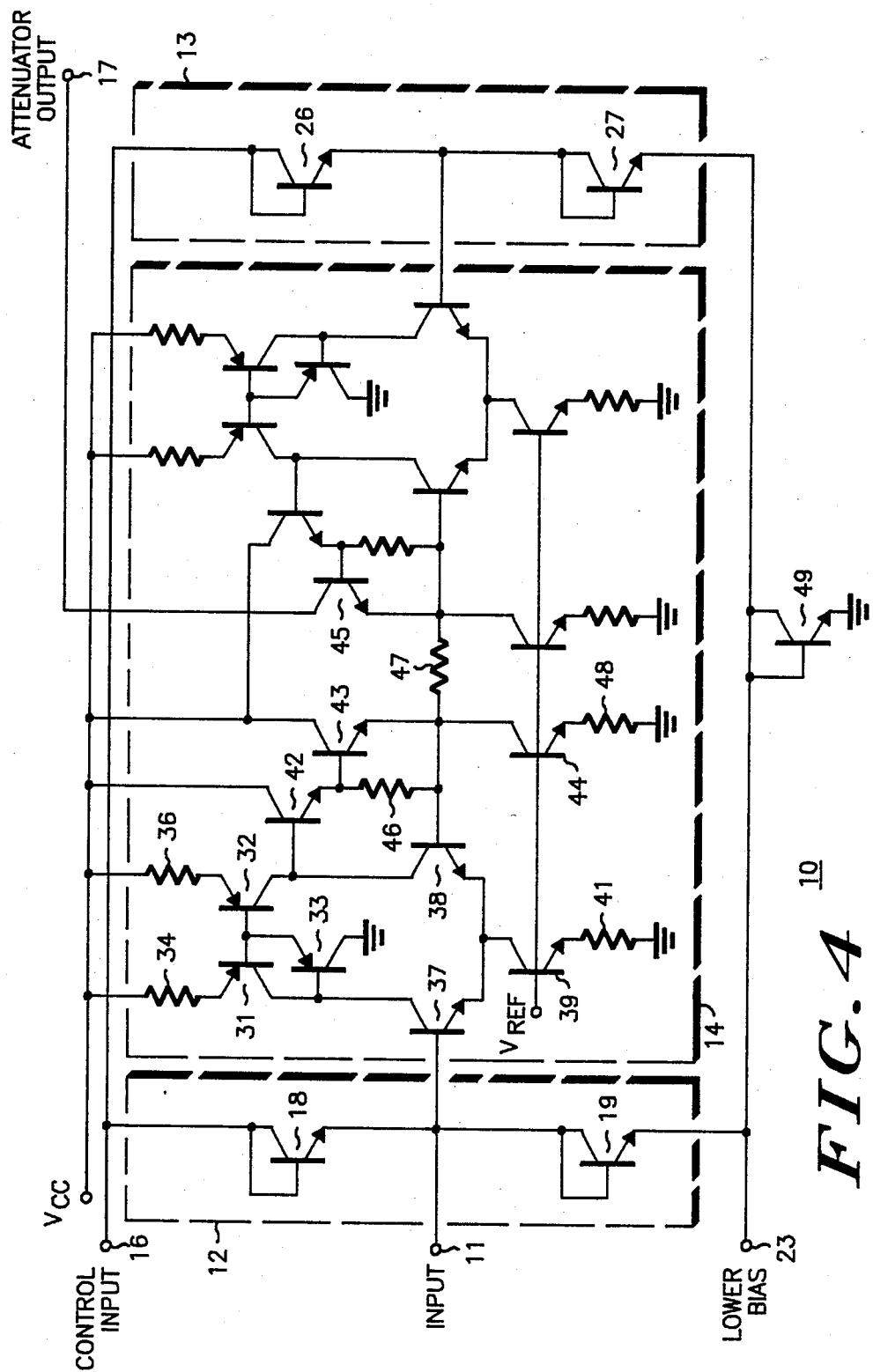
FIG. 4 comprises a schematic diagram of a first embodiment.

Referring now to the drawings, and in particular to FIG. 2, a first embodiment of the invention can be seen as depicted generally by the numeral 10. This first embodiment (10) includes an input (11), an attenuator (12), a dynamic reference signal unit (13), a comparison unit (14), a control input (16), and an attenuator output (17). The attenuator (12) receives an input signal at the input (11), which signal is to be attenuated as necessary. The degree of attenuation depends in part upon the control input signal as received by the control input (16). The dynamic reference signal unit (13) provides a reference signal as a function of a DC variable signal that effects the accuracy of the attenuator signal. The comparison unit (14) compares the attenuator signal with the reference signal to provide a signal at the attenuator output (17) that substantially comprises the former minus the latter signal.

Referring now to FIG. 3, a somewhat more detailed depiction of the first embodiment (10) will be provided. The attenuator (12) can be comprised of two diodes (18 and 19) and a capacitor (21). The capacitor (21) couples the input (11) to an attenuation node (22). The first diode (18) connects between the attenuation node (22) and the control input (16). The second diode (19) connects between the attenuation node (22) and a lower bias (23).

The dynamic reference signal unit (13) can be similarly comprised of two diodes (26 and 27). The first diode (26) connects between the control input (16) and a reference node (28). The remaining diode (27) connects between the reference node (28) and the lower bias (23).

The comparison unit (14) can be comprised of a comparator (29) having a noninverting input that connects to the attenuation node (22) and an inverting input that connects to the reference node (28). The comparator (29) also has an output that serves as the attenuator output (17).

So configured, attenuation by the attenuator (12) will be a function of the current flowing through the diodes (18 and 19). This current flow, in turn, comprises a function of the control input (16). This control input (16) can, in turn, be made a function of the attenuator output in accordance with well understood prior art techniques to establish a stable closed loop control system.

The dynamic reference signal unit (13) provides a reference signal to the comparison unit (14) that substantially tracks the DC component of the attenuator (12) as the DC component varies with current flow and temperature. Signal and distortion components occurring on the control input (16) and lower bias (23) are common mode to the comparison unit (14) and are thus cancelled. As a result, the output coupling capacitor required pursuant to prior art techniques can be dispensed with, while simultaneously gaining more stable performance, and lower distortion.

Referring now to FIG. 4, the first embodiment will be described in greater detail as regards a particular implementation thereof.

The two diodes (18 and 19) of the attenuator (12) can be comprised of diode configured transistors as depicted. This constitutes a satisfactory configuration in an integrated circuit. Similarly, the two diodes (26 and 27) of the dynamic reference signal unit (13) can also be comprised of diode configured transistors.

The comparison unit (14) can be comprised of a differential amplifier that includes two current mirrors, two voltage gain sections, and two current gain sections. Since each current mirror, voltage gain section, and current gain section is duplicated on either side of the differential amplifier, only one of each will be described in detail, except where differences need be noted.

The current mirror includes three PNP transistors (31, 32, and 33). The first transistor (31) has an emitter that connects through an 8.2 k ohm resistor (34) to $V_{CC}$, a base that connects to the base of the second transistor (32) and to the emitter of the third transistor (33), and a collector that connects to the base of the third transistor (33) and to a voltage gain section as described below in more detail. The second transistor (32) has an emitter that connects through an 8.2 k ohm resistor (36) to $V_{CC}$ and a collector that connects to the voltage gain section and the current gain section as described below in more detail. The collector of the third transistor (33) connects to ground.

The voltage gain section includes three transistors (37, 38, and 39) as well. The first transistor (37) has a base that connects to the input (11), a collector that connects to the collector of the first current mirror transistor (31), and an emitter that connects in common to the emitter of the second transistor (38) and to the collector of the third transistor (39). The second transistor (38) has a collector that connects to the collector of the second current mirror transistor (32) and a base that connects to the current gain section as described below in more detail. The third transistor (39) has a base connected to an appropriate reference voltage ($V_{REF}$) and an emitter that connects to a grounded 8.2 k ohm resistor (41). So configured, the third transistor (39) comprises a 15 microamp current source.

The current gain section also includes three transistors (42, 43, and 44). The first transistor (42) has a collector that connects to $V_{CC}$, a base that connects to the collector of the second current mirror transistor (32), and an emitter that connects to the base of the second transistor (43) and through a 24 k ohm resistor (46) to the emitter of the second transistor (43) and to the base of the second voltage gain section transistor (38). The second transistor (43) has a collector that connects to $V_{CC}$ and an emitter that connects to the collector of the third transistor (44) and through a 120 ohm resistor (47) to its counterpart (45) on the opposite side of the differential amplifier. The third transistor (44) has a base that connects to an appropriate reference voltage ($V_{REF}$) and an emitter that connects to a grounded 160 ohm resistor (48). So configured, the third transistor (44) comprises a 0.3 milliamp current source.

The remaining current mirror, voltage gain section, and current gain section are configured as described above, with the exception that the voltage gain section couples to the dynamic reference signal unit (13) instead of the input (11), and the output of the current gain section connects instead to the attenuator output (17). In addition, a diode configured transistor (49) may be connected between the lower bias (23) and ground.

Referring now to FIG. 5, a second embodiment of the invention can be seen as depicted generally by the numeral 100. In addition to including the attenuator (12), the dynamic reference signal unit (13), and the comparison unit (14) of the first embodiment (10), the second embodiment (100) also includes a variable impedance unit (101). The variable impedance unit (101) also responds to the control input (16), the attenuator (12), and dynamic reference signal unit (13) to effectively expand the attenuation range of the overall circuit. Referring now to FIG. 6, a more detailed description of the second embodiment (100) will be provided.

The attenuator (12) and the dynamic reference signal unit (13) can again be comprised of two diodes each (18 and 19, and 26 and 27, respectively). Similarly, the comparison unit (14) can again be comprised of a differential amplifier (29).

This embodiment (100) also depicts an envelope detector (102). The envelope detector (102) connects to the attenuator output (17) and provides an output signal to the control input (16) to provide the necessary steering current as described above. The envelope detector (102) is well known and understood in the prior art, and hence no additional description need be provided here.

The variable impedance unit (101) can be comprised of a delayed threshold section and a gain controlled amplifier with variable open loop output impedance (104). The inverting input of this amplifier (104) connects to the attenuation node (22). The noninverting input of the amplifier (104) connects to the reference node (28). In addition, the output of the amplifier (104) connects to the inverting input thereof.

The output of the envelope detector is a function of the magnitude of the attenuated output signal at the attenuator output (17). Since the impedance at the inverting input of the amplifier (104) essentially equals the output impedance of the amplifier divided by its gain, the impedance at the attenuation node (22) can therefore be made, at least in part, a function of the gain of the amplifier (104) as well as a function of the current flowing through the two diodes (18 and 19) that comprise the attenuator (12).

So configured, the second embodiment (100) further reduces distortion and provides a greater overall attenuation capability.

Figure 7:
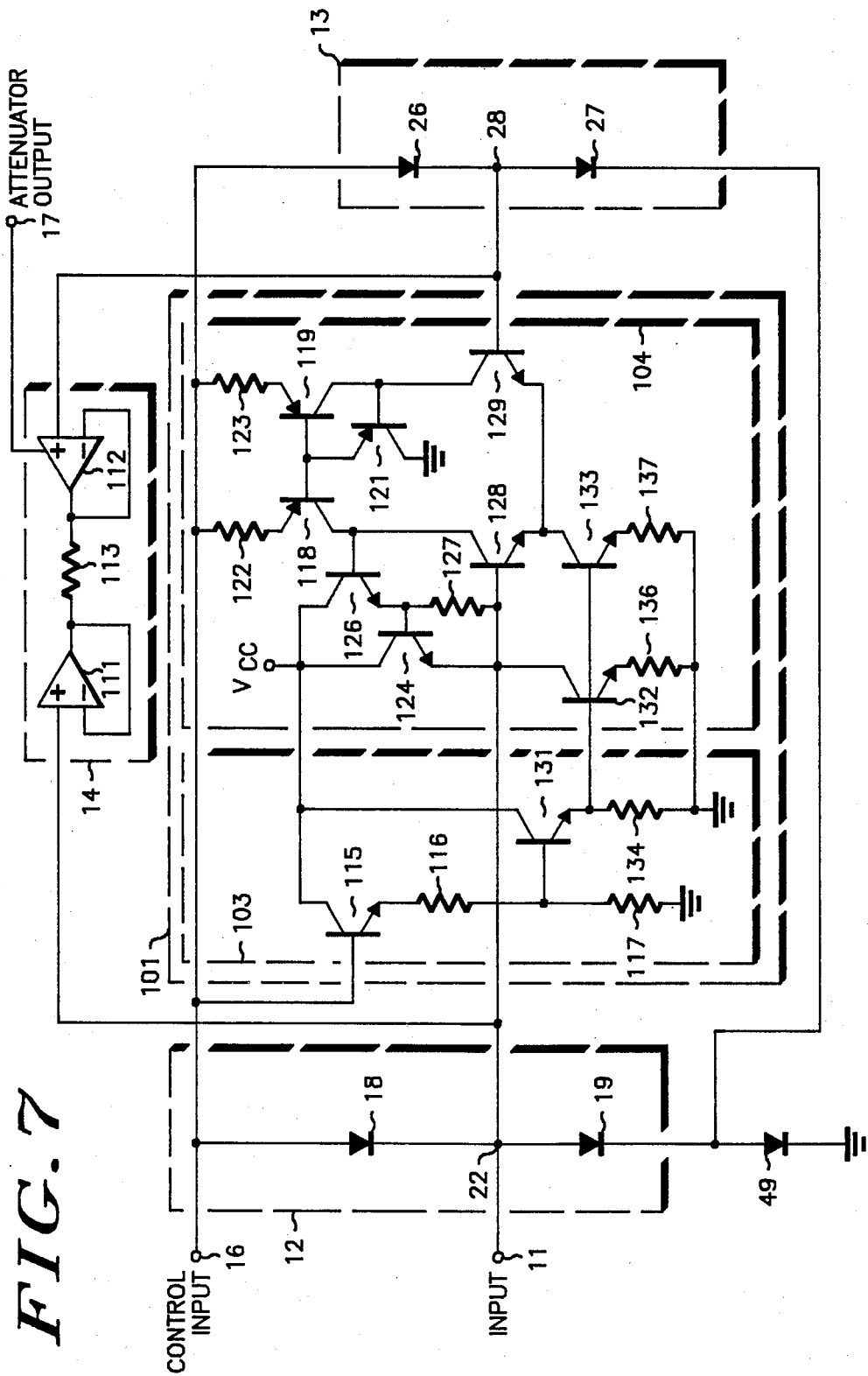
FIG. 7 comprises a schematic diagram of a second embodiment.

Referring now to FIG. 7, a more detailed schematic description of the second embodiment (100) will be described.

The attenuator (12) again includes a first and second diode (18 and 19) configured in series between a control input (16) and a lower bias (in this case diode (49)).

The dynamic reference signal unit (13) has been configured identically to the attenuator (12), with like numerals referring to like components described above. Therefore, additional description will not be provided here.

The comparison unit (14) again comprises a differential amplifier, represented here by two comparators (111 and 112). The outputs of both comparators (111 and 112) are connected together by a low ohmage resistor (113) (such as 100 ohms), with the collector drive current of one of the comparators (112) comprising the attenuator output (17).

The variable impedance unit (101) includes a delayed threshold section (103) and a gain controlled amplifier (104). These sections will now be described.

The delayed threshold section includes a transistor (115), a 4 k ohm resistor (116), and a grounded 10 k ohm resistor (117). The base of the transistor (115) connects to the control input (16), the collector connects to $V_{CC}$, and the emitter connects through the 4 k ohm resistor (116) to both the base of transistor (131) and the 10 k ohm resistor (117). The collector of transistor (131) connects to $V_{CC}$ and the emitter connects to a 10 k resistor (134) and the current source (described below in more detail).

The current mirror includes three transistors (118, 119, and 121). The first transistor (118) has an emitter that connects to the control input (16) through an appropriate resistor (122), a base that connects to the base of the second transistor (119) and to the emitter of the third transistor (121), and a collector that connects to the output impedance section as described in more detail below. The second transistor (119) also has an emitter that connects to the control input (16) through an appropriate resistor (123). The collector of the second transistor (119) connects to the base of the third transistor (121) and to the gain section as described in more detail below. Finally, the collector of the third transistor (121) connects to ground.

The output impedance section includes two transistors (124 and 126). The first transistor (124) has a collector that connects to $V_{CC}$ and an emitter that connects to the attenuation node (22). The second transistor (126) has a collector that connects to $V_{CC}$, a base that connects to the collector of the first current mirror transistor (118), and an emitter that connects to the base of the first transistor (124) and through an appropriate resistor (127) to the attenuation node (22).

The gain section includes two transistors (128 and 129). The base of the first transistor (128) connects to the attenuation node (22). The collector of the first transistor (128) connects to the collector of the first current mirror transistor (118). The second transistor (129) has a base that connects to the reference node (28) and a collector that connects to the collector of the second current mirror transistor (119). The emitters for both gain section transistors (128 and 129) are connected in common and also to the current source section described below.

The current source section includes transistors 132, and 133. The base of the first transistor (131) connects to the delayed AGC linear threshold section as described above. The base for transistor (132) connects to the emitter of transistor (131). The collector for this transistor (132) connects to the attenuation node (22) and the emitter connects to a grounded 100 ohm resistor (136). The second transistor (133) has a base that also connects to the emitter of transistor (131), a collector that connects to the emitters of the two gain section transistors (128 and 129), and an emitter that connects to a grounded 10 k ohm resistor (137).

So configured, the control input (16) can receive the signal that not only varies the impedance of the attenuator diodes (18 and 19) but that also effects the apparent impedance of the variable impedance unit (101).

Those skilled in the art will appreciate that various modifications could be made with respect to the above described embodiments without departing from the principle spirit of the invention. It should therefore be understood that the scope of the claims should not be considered as being limited to the precise embodiments set forth, in the absence of express limitations clearly directed to such particular embodiments.

We claim:
1. In an attenuator having:
   (i) an input for receiving an input signal; and
   (ii) an output for providing an output signal that substantially comprises said input signal attenuated as necessary to assure that said output signal does not substantially exceed a threshold level, wherein said output signal may include a DC component that varies with current flow and temperature;

an improvement comprising:
   (A) dynamic reference signal means for providing a reference signal that substantially tracks said DC component; and
   (B) comparison means for receiving said output signal and said reference signal and for comparing said signals to thereby provide an attenuator output signal substantially equal to said output signal less said reference signal, wherein said comparison means includes negative feedback means for controlling, at least in part, said comparison means in response to a signal produced by said comparison means.

2. The attenuator of claim 1 wherein said comparison means comprises a differential amplifier having at least two transistors, each of which two transistors includes an emitter, and said negative feedback means includes a resistance coupled between said emitters of said two transistors.

3. The attenuator of claim 1 wherein said dynamic reference signal means comprises:
a first diode connected between said comparison means and a first bias potential; and
a second diode connected between said comparison means and a second bias potential.

4. The attenuator of claim 3 wherein said second bias potential is greater than said first bias potential.

5. The attenuator of claim 1 and further including variable impedance means having a first input connected to said output and a second input connected to said dynamic reference signal means for increasing attenuation of said output signal as necessary to aid in preventing said output signal from exceeding said threshold level.

6. In an attenuator having:
(i) an input for receiving an input signal; and
(ii) an output for providing an output signal that substantially comprises said input signal attenuated as necessary to assure that said output signal does not substantialy exceed a threshold level, wherein said output signal may include a DC component that varies with current flow and temperature;
an improvement comprising:
(A) dynamic reference signal means for providing a reference signal that substantially tracks said DC component;
(B) comparison means for receiving said output signal and said reference signal and for comparing said signals to thereby provide an attenuator output signal substantially equal to said output signal less said reference signal; and
(C) variable impedance means having a first input connected to said output and a second input connected to said dynamic reference signal means for increasing attenuation of said output signal as necessary to aid in preventing said output signal from exceeding said threshold level.

7. The attenuator of claim 6 wherein said variable impedance means comprises an adjustable gain amplifier 8. The attenuator of claim 7 wherein said adjustable gain amplifier has a gain that is controlled as a function of said attenuator output signal.

9. The attenuator of claim 7 wherein said adjustable gain amplifier has an output and further includes feedback means for connecting said output to an input of said adjustable gain amplifier.

10. The attenuator of claim 7 wherein said adjustable gain amplifier includes an inverting input that connects to said output and a noninverting input that connects to said dynamic reference signal means.

11. The attenuator of claim 10 wherein said adjustable gain amplifier further includes an output and a feedback loop for connecting said output to said inverting input.

12. In an attenuator having:
an input for receiving an input signal;
an output for providing an output signal that substantially comprises said input signal does not attenuated as necessary to assure that said output signal does not substantially exceed a threshold level, wherein said output signal may include a DC component that varies with current flow and temperature;
a first diode connected between said input and a first bias potential; and
a second diode connected between said input and a second bias potential, said second bias potential having a higher potential than said first bias potential;
an improvement comprising:
(A) dynamic reference signal means for providing a reference signal that substantially tracks said DC component; and
(B) comparison means for receivingsaid output signal; and said reference signal and for comparing said signals to thereby provide an attenuator output signal substantially equal to said output signal less said reference signal, wherein said comparison means includes negative feedback means for controlling, at least in part, said comparison means in response to a signal produced by said comparison means.

13. The attenuator of claim 12 and further including variable impedance means having a first input connected to said output and a second input connected to said dynamic reference signal means for increasing attenuation of said output signal as necessary to aid in preventing said output signal from exceeding said threshold level.

14. The attenuator of claim 13 wherein said variable impedance means comprises an adjustable gain amplifier.

15. The attenuator of claim 14 wherein said adjustable gain amplifier has a gain that is controlled as a function of said attenuator output signal.

16. The attenuator of claim 15 wherein said adjustable gain amplifier includes an output and further provides feedback between said output and an input thereto.

17. The attenuator of claim 16 wherein said adjustable gain amplifier includes an inverting input that connects to said output of said adjustable gain amplifier and to said output of said attenuator, and a noninverting input that connects to said dynamic reference signal means.

* * * * *

UNITED STATES PATENT AND TRADEMARK OFFICE
CERTIFICATE OF CORRECTION

PATENT NO. : 4,736,166

DATED : April 5, 1988

INVENTOR(S) : Lawrence M. Ecklund et al.

It is certified that error appears in the above-identified patent and that said Letters Patent is hereby corrected as shown below:

Inventor's name is incorrect "Eckland" should be --Ecklund--.

Column 8, line 11, after the word "signal" please delete the words --does not--.

Column 8, line 27, there should be a space between the words "receiving" and "said".

Signed and Sealed this

Twentieth Day of September, 1988

Attest:

DONALD J. QUIGG

*Attesting Officer*

*Commissioner of Patents and Trademarks*